US010627729B2

(12) United States Patent
Schmitt-Weaver et al.

(10) Patent No.: US 10,627,729 B2
(45) Date of Patent: Apr. 21, 2020

(54) CALIBRATION METHOD FOR A LITHOGRAPHIC APPARATUS

(71) Applicant: ASML Netherlands B.V., Veldhoven (NL)

(72) Inventors: Emil Peter Schmitt-Weaver, Eindhoven (NL); Jens Stäcker, Eindhoven (NL); Koenraad Remi André Maria Schreel, Veldhoven (NL); Roy Werkman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 194 days.

(21) Appl. No.: 15/736,451

(22) PCT Filed: May 27, 2016

(86) PCT No.: PCT/EP2016/062070
§ 371 (c)(1),
(2) Date: Dec. 14, 2017

(87) PCT Pub. No.: WO2016/202560
PCT Pub. Date: Dec. 22, 2016

(65) Prior Publication Data
US 2018/0173118 A1  Jun. 21, 2018

(30) Foreign Application Priority Data

Jun. 18, 2015 (EP) ..................................... 15172798
Dec. 16, 2015 (EP) ..................................... 15200409

(51) Int. Cl.
*G03F 9/00* (2006.01)
*G03F 7/20* (2006.01)

(52) U.S. Cl.
CPC ............ *G03F 9/7019* (2013.01); *G03F 7/705* (2013.01); *G03F 7/70516* (2013.01); *G03F 7/70633* (2013.01)

(58) Field of Classification Search
CPC .. G03F 7/705; G03F 7/70516; G03F 7/70633; G03F 9/7019

USPC ............................................................ 430/5
See application file for complete search history.

(56) References Cited

U.S. PATENT DOCUMENTS

| 9,009,647 B2 | 4/2015 | Ye et al. |
| 2002/0036758 A1 | 3/2002 | de Mol et al. |
| 2005/0185174 A1 | 8/2005 | Laan et al. |
| 2006/0114437 A1 | 6/2006 | Akhssay et al. |
| 2007/0096094 A1 | 5/2007 | Levinski et al. |
| 2012/0008127 A1 | 1/2012 | Tel et al. |
| 2013/0230797 A1 | 9/2013 | Van Der Sanden et al. |
| 2013/0258306 A1 | 10/2013 | Huang et al. |

FOREIGN PATENT DOCUMENTS

| JP | H10270313 A | 10/1998 |
| JP | 3127851 B2 | 1/2001 |
| JP | 2010-114444 A | 5/2010 |

OTHER PUBLICATIONS

International Search Report and Written Opinion of the International Searching Authority directed to related International Patent Application No. PCT/EP2016/062070, dated Jul. 25, 2016; 9 pages.
International Preliminary Report on Patentability directed to related International Patent Application No. PCT/EP2016/062070, dated Dec. 19, 2017; 6 pages.

*Primary Examiner* — Christopher G Young
(74) *Attorney, Agent, or Firm* — Sterne, Kessler, Goldstein & Fox P.L.L.C.

(57) ABSTRACT

A first substrate (2002) has a calibration pattern applied to a first plurality of fields (2004) by a lithographic apparatus. Further substrates (2006, 2010) have calibration patterns applied to further pluralities of fields (2008, 2012). The different pluralities of fields have different sizes and/or shapes and/or positions. Calibration measurements are performed on the patterned substrates (2002, 2006, 2010) and used to obtain corrections for use in controlling the apparatus when applying product patterns to subsequent substrates. Measurement data representing the performance of the apparatus on fields of two or more different dimensions (2004, 2008, 2012) is gathered together in a database (2013) and used to synthesize the information needed to calibrate the apparatus for a new size. Calibration data is also obtained for different scan and step directions.

15 Claims, 9 Drawing Sheets

CALIBRATION METHOD FOR A LITHOGRAPHIC APPARATUS

CROSS-REFERENCE TO RELATED APPLICATIONS

This application claims priority of EP application 15172798.9 which was filed on Jun. 18, 2015 and EP application 15200409.9 which was filed on Dec. 16, 2015 which are incorporated herein in its entirety by reference.

FIELD

The invention relates to lithographic apparatuses, and in particular to calibration methods for lithographic apparatuses and computer program products for implementing such methods. The invention further relates to methods of device manufacture.

BACKGROUND

A lithographic process is one that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a field (e.g. comprising part of, one, or several product dies) on a substrate (e.g. a silicon wafer). Transfer of the pattern is typically via imaging onto a layer of radiation-sensitive material (resist) provided on the substrate. Stepping and/or scanning movements can be involved, to repeat the pattern at successive target portions across the substrate. It is also possible to transfer the pattern from the patterning device to the substrate by imprinting the pattern onto the substrate. In the following description of examples, the term "exposure" may be used for convenience to refer to the step of applying a pattern to a field or to a substrate, without indicating any limitation to optical imaging or to exclude imprinting.

A key performance parameter of the lithographic apparatus is the overlay error. This error, often referred to simply as "overlay", is the error in placing a product features in the correct position relative to features formed in previous layers. As device structures become every smaller, overlay specifications become ever tighter. Overlay will be used as a main example of performance parameter in the present disclosure, while the concepts and techniques disclosed herein can in principle be applied to the measurement and improvement of other performance parameters as well. Examples of performance parameters of a lithographic process include for example critical dimension (CD), CD uniformity and the like.

Currently the overlay error is controlled and corrected by means of methods such as advanced process control (APC) described for example in US2012008127A1 and wafer alignment models described for example in US2013230797A1.

Within the lithographic apparatus, wafer alignment models are conventionally applied based on measurement of alignment marks provided on the substrate. The measurements are made by the lithographic apparatus as a preliminary step of every patterning operation. The alignment models may include higher order models, to correct for non-linear distortions of the wafer. The alignment models may also be expanded to take into account other measurements and/or calculated effects such as thermal deformation during a patterning operation During operation, advanced process control is able to stabilize performance of a lithographic apparatus, but, to achieve good performance in the first place, it is generally necessary to perform a calibration of the apparatus after any interruption in operation. Calibration, broadly speaking, involves (i) using the apparatus, (ii) measuring the performance of the apparatus and (iii) based on errors observed in the measured performance, controlling the apparatus to correct the errors and improve performance in subsequent production. To achieve the highest possible performance, many individual variables have to be measured and taken into account.

As an example of such variables, some errors may be classed as "intra-field" errors that recur systematically depending on the position within each field. Other errors may be classed as "inter-field" errors that recur systematically as a function of position on the substrate as a whole. Furthermore, overlay in a particular field may be dependent on the particular scanning direction and/or stepping direction that is used by the lithographic apparatus to expose all the fields in an efficient manner. Changes in the product field size and/or exposure sequence may therefore change the performance of the apparatus. Consequently, to obtain highest performance currently requires new calibration of the lithography apparatus for each change in the product pattern (field size), or even if a new exposure sequence or new grid positioning is to be used. Calibration may have to be performed separately for each chuck (substrate support) that may be used within the apparatus. Production is interrupted during the calibration. This directly reduces the production throughput of the lithographic apparatus. If the apparatus will be used for a long period to produce the same product, the lost throughput may be acceptable. Other times, however, a lithographic apparatus is used to produce a number of different product layouts day-by-day or hour-by-hour, according to customer demand. Recalibrating the apparatus for each individual layout or sequence is unfeasible, even for relatively modest numbers of individual layouts, since it would significantly reduce production throughput.

SUMMARY

It is therefore desirable to reduce the amount of time required to calibrate a lithographic apparatus. Additionally, it is desirable to improve the accuracy of the lithographic apparatus by reducing the overlay error due to the specific movements of the lithographic apparatus.

According to a first aspect of the present invention, there is provided method of calibrating a lithographic apparatus, comprising:
  providing first measurement data for a first plurality of fields that have been applied by the lithographic apparatus on one or more substrates, each field in the first plurality of fields having a first layout;
  providing further measurement data for one or more further pluralities of fields that have been applied by the lithographic apparatus on one or more substrates, each of the one or more further pluralities of fields having a layout different from the first layout;
  creating a prediction function based on the first measurement data and the further measurement data; and
  using the prediction function to determine a set of data for at least a first plurality of product fields having a product layout.

The set of data may directly or indirectly be used to obtain correction parameters for the lithographic apparatus to use when applying a product pattern to a substrate. The product fields may have product field dimensions different from both the first field dimensions and the further field dimensions. The product fields alternatively or in addition may have positions shifted relative to the fields of the first plurality of fields and further plurality of fields. Correction parameters specific to the product field dimensions can be obtained, regardless whether the product field dimensions and/or positions are different to the calibration field dimensions.

In a particular embodiment, the prediction function predicts overlay performance of the lithographic apparatus, and is used to correct overlay when applying a product pattern to product fields on a substrate using a product layout.

The set of correction parameters may be parameters for an alignment model.

The method may further comprise using the determined data to derive correction parameters for use in controlling the lithographic apparatus to apply a product pattern to plurality of fields on a product substrate. The method may further comprise using the correction parameters to control the lithographic apparatus when applying the product pattern to a substrate in fields having the product field layout.

In some embodiments of the invention, prediction functions are obtained with regard to inter-field contributions and intra-field contributions separately.

In some embodiments of the invention, prediction functions are obtained that can be used to predict performance for different specific exposure sequences. For example, in a scanning type of patterning operation, specific prediction functions can provide predictions of performance for a field specific to the scanning and stepping directions used to apply a pattern to that field in a given exposure sequence. The predictions can be obtained regardless whether actual calibration substrates have been produced using that field size or using that exposure sequence.

The invention further provides a method of manufacturing devices by using a lithographic apparatus to apply product patterns to substrates, the lithographic apparatus applying said product patterns to fields having a product layout using correction parameters obtained by the method according to any aspect of the invention as set forth above or in the embodiments below.

The invention further provides a computer program product comprising machine-readable instructions for causing a data processing apparatus or apparatuses to implement a method of calibration according to any aspect of the invention as set forth above or in the embodiments below.

These and further features and advantages of the invention will be apparent to the skilled reader from a consideration of the detailed description of examples that follows.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
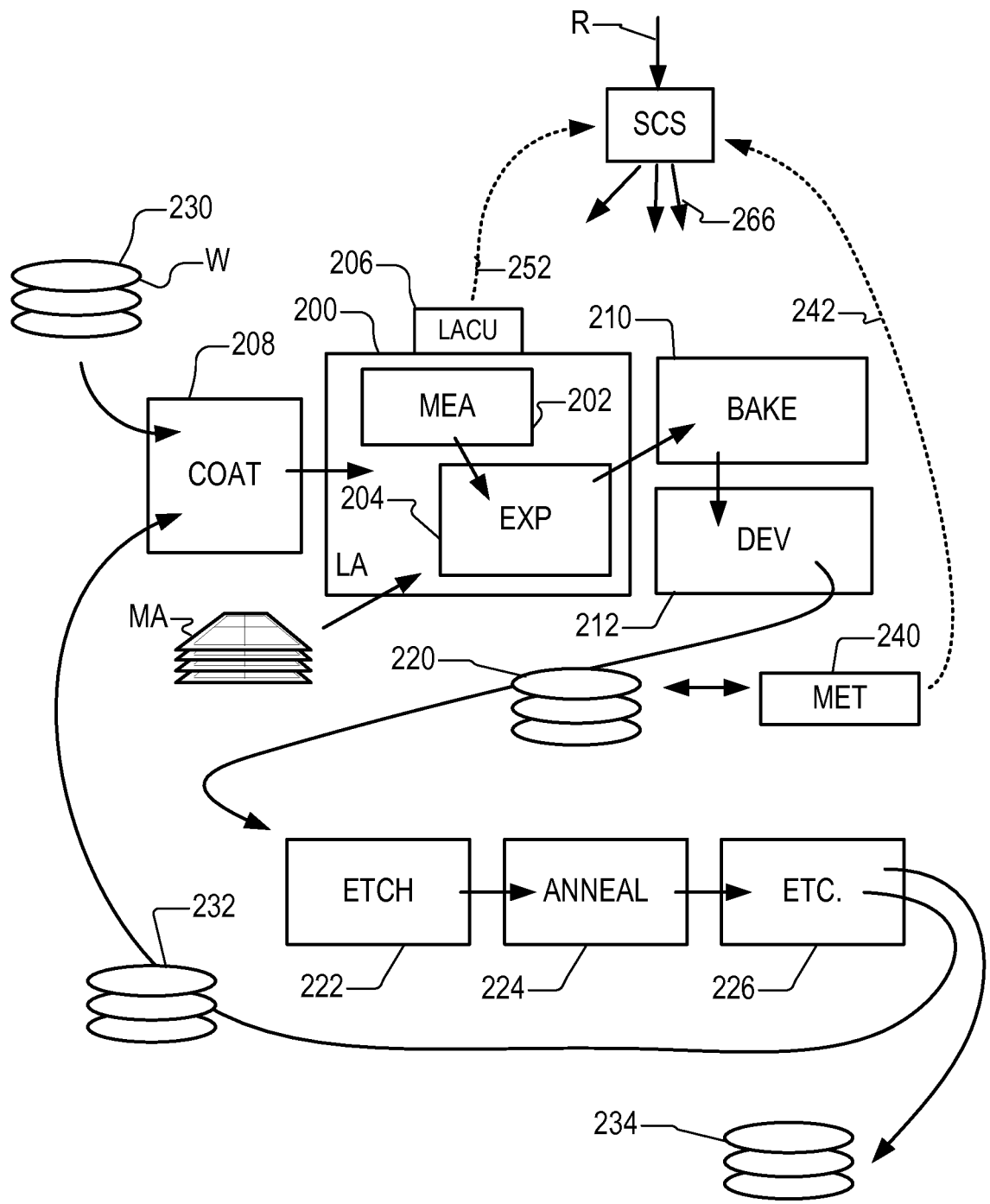
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many fields across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA in this example is of a so-called dual stage type which has two substrate tables WTa and WTb and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

The metrology system in FIG. 1 includes a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

As is well known, the pattern applied in one exposure covers only a small portion of the substrate at a time, and the same pattern is typically applied repeatedly over the substrate to make full use of the capacity of the substrate and of the production facility as a whole. The portion to which the pattern is applied is termed a "field", and its maximum size is limited by the field of view of the optical projection system and other limitations of the apparatus design. On the other hand, not all products require a die which fits neatly within that maximum field size. Wasted space on a substrate is not tolerable in view of the cost of establishing and running the production facility, and so for each product a particular size and shape smaller than the maximum size will generally be selected. In the example of the scanning mode of operation, the lithographic apparatus can be controlled to operate with a shorter scan length and/or a shorter step size, to ensure optimum filling of the substrate area with fields of and particular size and shape.

As explained in the introduction, to obtain best performance in terms of overlay or other performance parameters, a set of calibration measurements is performed on one or several substrates to which calibration patterns have been applied by the individual lithographic apparatus. The calibration patterning operations impact the throughput of product substrates. One particular problem in this regard is that overlay performance of a particular lithographic apparatus will be different for different products and layouts. For example some layouts have different field sizes. An operator may wish to use the same lithographic tool for several products, each with a different field size. Even if the field size does not change, other parameters of the exposure process may change, for example the sequence of up/down and left/right movements used in the exposure of fields in a grid layout, and/or the position of the grid relative to the substrate. Therefore to obtain best performance it may be necessary to carry out calibrations specific to each product and each grid layout, before starting production of the product. This significantly increases the time, and thereby cost, of the calibration process.

Figure 2:
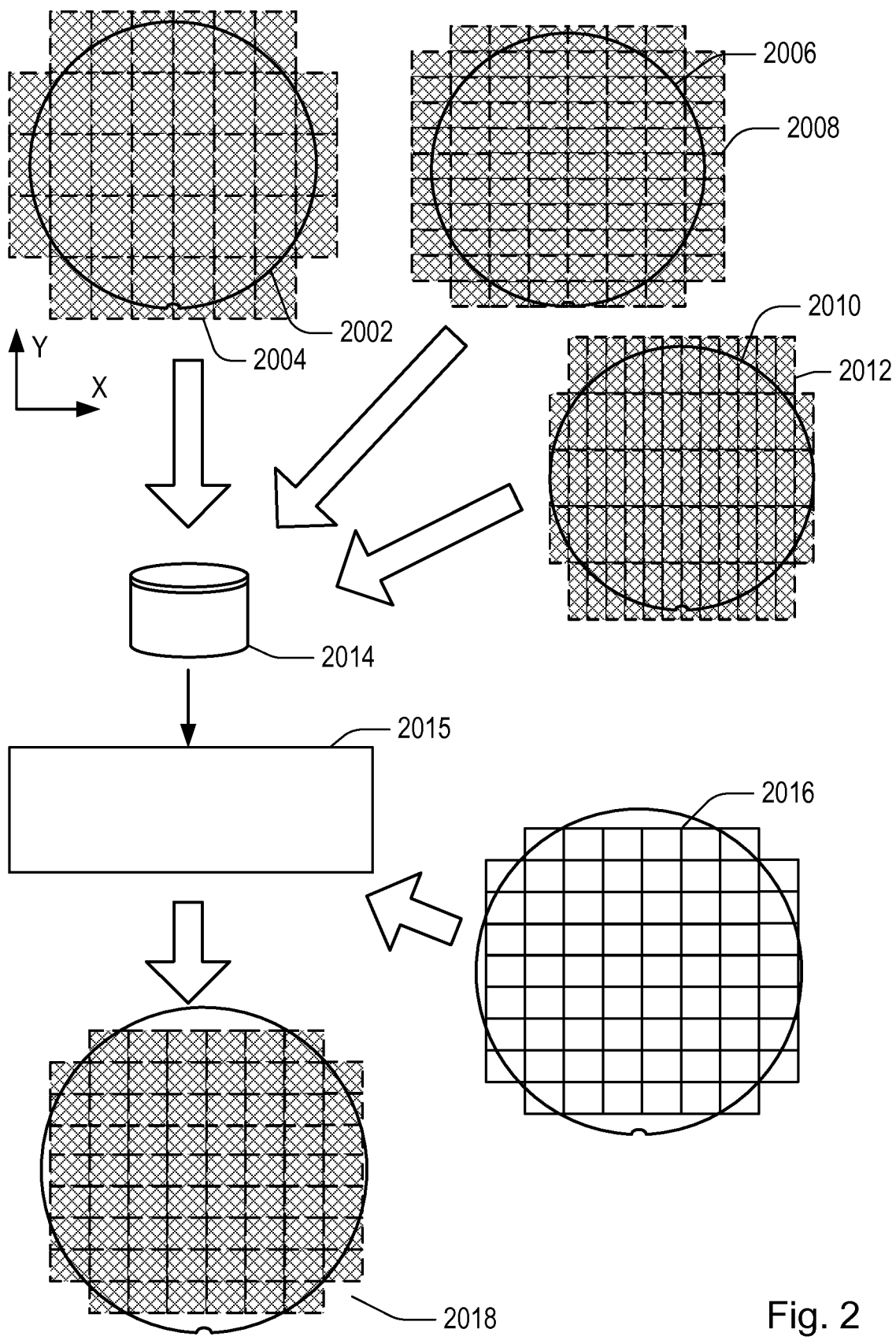
FIG. 2 depicts the principle of a calibration method according to an embodiment of the invention.

FIG. 2 shows the principle of an exemplary method of calibration according to an aspect of the present disclosure. A first substrate 2002 has a calibration pattern applied to a first plurality of fields 2004. In the present example, the substrate is a calibration substrate on which a calibration pattern is applied to a plurality of equally sized and spaced fields. A second substrate 2006 has a calibration pattern applied to a plurality of fields 2008. A third substrate 2010 has a calibration pattern applied to a plurality of fields 2012. While the present example describes the use of dedicated calibration patterns and dedicated calibration substrates, the terms "calibration pattern" and "calibration substrate" are not intended to exclude the use of actual product patterns for the purposes of calibration.

The fields 2004, 2008, 2012 on the first, second and third substrates have different sizes and shapes, as shown in the FIG. 2. Each field has, for example, a height in a Y direction and a width in an X direction. (It will be understood that these terms refer only to the appearance of the pattern in the plane of the substrate, and not to height relative to earth or gravity). In other words, each field 2004 on the first substrate has a first set of field dimensions, each field in the second plurality has a second set of unique field dimensions, and each field in the third plurality has a third set of unique field dimensions. Substrates 2002, 2006 and 2010 are shown in FIG. 2 as separate substrates, which may be a convenient implementation. Different field sizes could in principle be mixed on a single substrate, provided that the performance of the apparatus in applying patterns with these different field sizes can be measured separately. Methods for obtaining multiple measurements on one substrate will be explained in further detail below.

As mentioned above, the maximum size of a field is determined by the design of the lithographic apparatus. In the illustrated example, the fields 2004 on substrate 2002 have this maximum field size. Accordingly, particular products will generally be designed and laid out using smaller fields. Fields 2008 have a "short, fat" size and shape, while fields 2012 have a "tall, thin" size and shape. The exemplary method is not limited to three sets of field dimensions, and it may be desirable to use one, two, four, five or more different sizes and shapes to obtain the best performance. (In other examples it may be that field size will not vary, or that performance is not sensitive to field size as much as it is to other parameters of interest.)

In the method disclosed herein calibration measurements are performed on the patterned substrates 2002, 2006, 2010 and used to obtain corrections for use in controlling the lithographic apparatus when applying product patterns to subsequent substrates. In the present method, however, calibration substrates and measurements are not prepared for every different size and shape of product field. Rather, measurement data representing the performance of the apparatus on fields of two or more different dimensions (fields 2004, 2008, 2012 in this example) is gathered together in a database 2013 and used to synthesize the information needed to calibrate the apparatus for a new size. From the database of measurements of calibration substrates with different field sizes, a prediction function 2014 is derived that can be used to obtain corrections specific to product field sizes, but without the need to make physical calibration patterns and measurements specific to those field sizes. The prediction function is used to simulate the performance of the lithographic apparatus when applying a product pattern with a particular product field size and shape.

As an example, a designed product field layout for a product substrate comprises a number of fields 2016. In this example, each field has a particular set of field dimensions which is different to the dimensions of the fields 2004, 2008, 2012. The designed product field layout is used as input for the prediction function 2015. The resulting output of the prediction function is a specific performance model 2018 for predicting the performance of the lithographic apparatus when patterning a substrate using the product field size. The predicted behavior can be used as input for a correction model in a lithographic apparatus, such as an alignment model to improve overlay performance. Metrology apparatus 240 of FIG. 1 can be used to make the measurements. The measurement data can be delivered as data 242 to database 2014 that lies within the supervisory control system, or it may lie within the lithographic apparatus control unit LACU. In any case, the control unit LACU in due course receives the information it requires for correcting any performance errors predicted by the specific performance model, and uses the information to improve performance when exposing product fields on real product substrates.

It will be appreciated that the corrections to be applied are (at least at a simplistic level) an inverse of errors predicted in the specific performance model. Accordingly, it is a matter of implementation whether the prediction function 2015 delivers its output firstly in the form of a prediction, which then has to be converted to correction parameters, or whether it is arranged to deliver directly the necessary correction parameters. To a large extent the implementation will depend simply on what form of data is easiest to handle by the control unit and its subsystems. The predicted performance model and/or correction parameters can be combined with corrections from other sources, such as the stability module, substrate process history and the like, to obtain a complete set of corrections. Of course for the individual substrate, the control unit also uses the alignment model based on measurements taken by alignment sensors and level sensors in the measuring station MEA, immediately prior to exposure.

Figure 3:
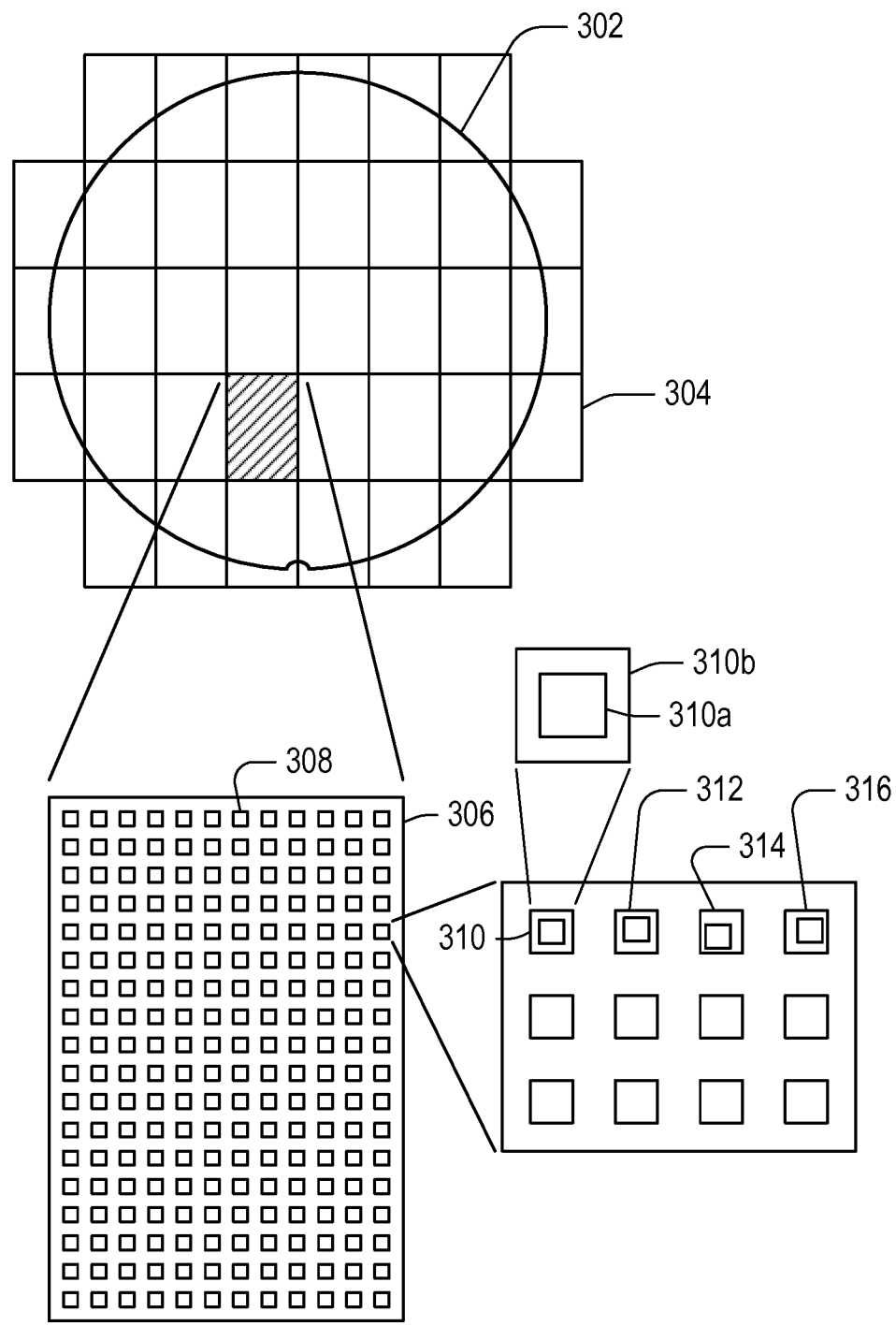
FIG. 3 shows schematically an example of a calibration pattern usable in the method of FIG. 2.

As described above, calibration measurements in accordance with one embodiment of the method are carried out on a plurality of calibration patterns applied to one or more calibration substrates. FIG. 3 shows an exemplary calibration substrate 302. The substrate is divided into a number of fields 304, each of which has a calibration pattern 306 applied to it. The pattern may be defined by providing a special calibration patterning device in the lithographic apparatus. Alternatively, a real product design may contain features usable for calibration. In one example, the target pattern comprises overlay targets located in target areas 308 uniformly spaced in a grid pattern across every field. As illustrated in the enlarged insert, each target area 308 may contain a plurality of individual targets 310, 312, 314, 316 etc. These targets are offset from one another by small amounts, while remaining at the general location of the area 308. This provision of multiple targets with offsets is to allow multiple exposures and multiple overlay measurements to be performed on the same substrate and at substantially the same locations. The offsets may be for example measured in tens of microns, while the field size is measured in tens of millimeters.

In the case of overlay targets, each individual target typically comprises a bottom mark in an underlying layer and a top mark to be formed in the present lithographic apparatus. The bottom marks may have been formed using the same lithographic apparatus or a different one. During application of a calibration pattern, a top mark is applied overlying a particular bottom mark in each target area 308. For example, in a particular calibration patterning operation, top mark 310a may be applied over bottom mark 310b. During a calibration measurement, the overlay error between the top target mark and the bottom target mark is measured. Overlay error causes the marks to be misaligned in one or both of the X and Y directions.

Within each individual target, features may typically be provided to allow measurement in both X and Y directions in a single structure target, or different targets may be provided in a composite target, for measuring overlay in X and Y separately. The drawing shows each target as a simple "box-in-box" target for the sake of illustration only. The targets may indeed be of 'box-in-box' type suitable for image-based overlay metrology; according to modern techniques, however, they may be gratings, to be measured by diffraction-based overlay in a well-known manner Hybrid targets having both image and grating features may be used. The exact type of target, and indeed the manner of measuring, is a matter of implementation. As mentioned, overlay is not the only performance parameter that might be measured, and other types of target and other metrology techniques may be applied, as appropriate to the parameters of interest.

As an example, each specific target in an overlay target area 308 may have been applied separately during successive exposures using different field sizes. As will be described further below, it may be desired that the prediction function 2015 can generate a performance model and correction parameters that take account of inter-field variations and intra-field variations in performance for the given product field size. It may further be desired that the prediction function 2015 can generate a performance model and correction parameters that take account of subtle variations in performance that are associated with different scanning directions and/or stepping direction. In other words, a calibration is desired that is specific to a particular exposure sequence, as well as a particular field size and shape, in order to obtain best performance.

Accordingly, in an example, it may be that target 310 has been formed during a first patterning operation, using a first set of field dimensions and a first combination of scan and step directions. Similarly, target 312 has been formed during a second patterning operation on the same field, using the first set of field dimensions and a second combination of scan and step directions. Target 314 has been formed during a third patterning operation, using the first set of field dimensions and a third combination of scan and step directions. Target 316 has been formed during a fourth patterning operation, using the first set of field dimensions and a fourth combination of scan and step directions. In this way, four sets of measurement data can be gathered from the one substrate. These four sets of measurement data can be used to develop the prediction function, as will be described in more detail below. By suitable design, it is possible to apply all the calibration marks in the same resist layer by multiple exposures. Alternatively one could make four cycles of coating, exposure and development.

Alternatively or additionally, targets in an overlay target area may be applied during successive exposures using different field dimensions. Whether this is possible will depend on the design of the calibration pattern. Using the example where three different field sizes are used to obtain measurement data for the database 2014, it will be noticed that the twelve targets in each area 308 conveniently allow for four sets of measurement data to be gathered for each of the three unique filed dimensions (2004, 2008, 2012).

As a general point, the skilled reader will know that metrology in this technical field typically requires that each value be measured several times to obtain a statistically reliable measurement and to eliminate as far as possible the effects of random error sources. Thus, for example, each set of calibration patterns may in practice be applied to several different substrates and each applied mark may be measured several times to obtain a single value for the overlay performance of the lithographic apparatus at that mark position. Any discussion of a patterning operation or a measurement in the present application therefore should be taken to refer potentially to the performance of several identical operations. The need to repeat patterning and measurement to obtain the highest accuracy highlights again the penalty in throughput that is incurred when a calibration has to be performed in a production facility.

While in this example a reference image providing multiple individual target marks with shifts is illustrated, this is not essential. Other embodiments may be envisaged in which multiple marks are printed with shifts relative to a single reference mark, and separate measurement values can be obtained from them. As also illustrated, even with the types of mark illustrated, multiple exposures can be made without shifts, where a pattern is applied at different field positions across the substrate, or different portions of a field are patterned in different exposures.

Figure 4:
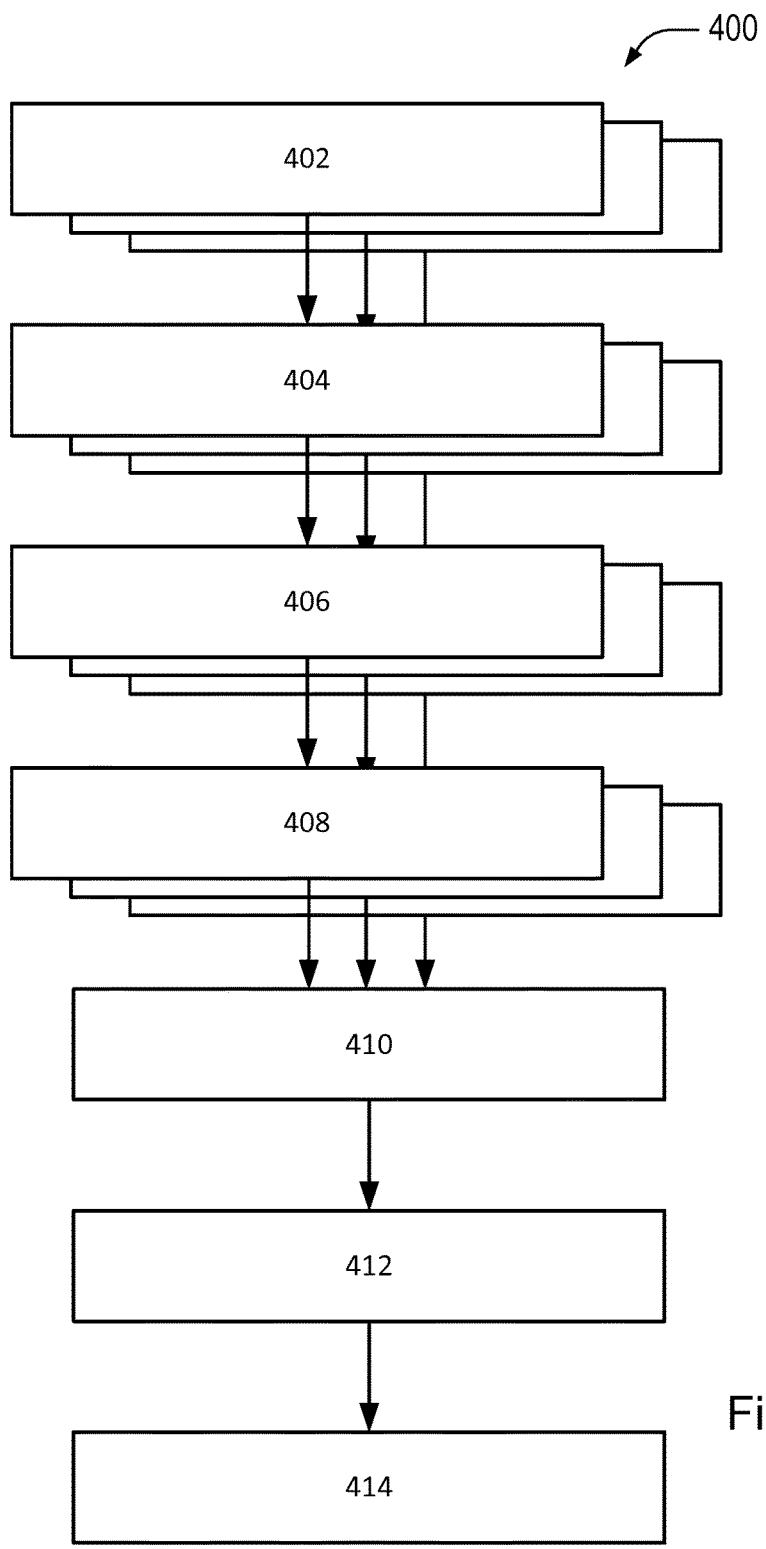
FIG. 4 is a flowchart of a calibration method according to an embodiment of the invention.

With reference to FIG. 4, a method 400 for carrying out a calibration according to the principles described above will now be described. The reference numerals in this figure refer to the following steps, each of which will be explained in more detail (with reference also to the other drawings):

402: apply calibration patterns to one or more substrates using different field dimensions;

404: perform calibration measurements on the calibration patterns;

406: group measurement data into sets and/or subsets, for example based on scan and step directions;

408: extract intra-field and inter-field fingerprints for each set and/or subset;

410: create prediction function;

412: use prediction function to predict performance for product fields having a new field dimensions and/or new exposure sequence; and

414: use predicted performance to obtain correction model for use in controlling operation of lithographic apparatus to expose product fields.

As will be seen from the drawing, the steps 402 to 408 are performed more than once, to create and measure calibration patterns using different field dimensions. The steps to obtain the measurement data for each set of field dimensions is the same, and so will only be described once.

In step 402 of the method 400 a calibration pattern is applied to successive fields across a calibration substrate, as will now be discussed in detail with reference to FIGS. 5 and 6. (FIG. 3 may also be recalled, for detail of the calibration pattern.)

Figure 5:
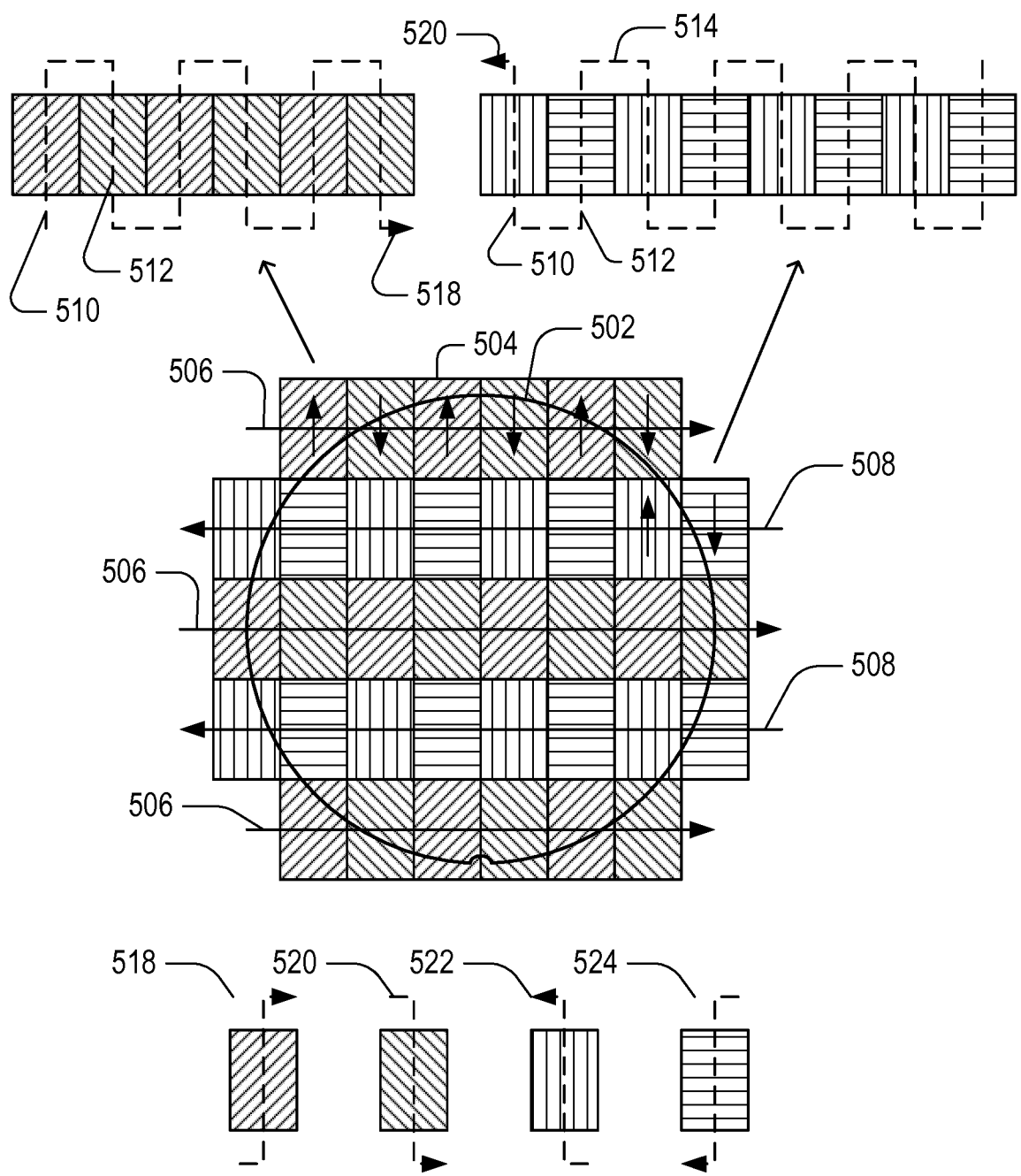
FIG. 5 is a schematic diagram of a calibration substrate patterned by a lithographic apparatus with a first exposure sequence in the method of FIG. 4.

As shown in FIG. 5, a calibration substrate 502 is divided into a number of fields 504 that are arranged in a grid pattern. During a patterning operation, patterns are applied to each field on the substrate in an exposure sequence. In a scanning-type lithographic apparatus, the exposure sequence comprises a sequence of stepping and scanning movements by which each field on a substrate is patterned in an efficient or advantageous manner. By convention, the stepping direction is aligned with the X axis of the substrate coordinate system. The scanning direction is aligned with the Y axis of the substrate coordinate system. It is to be noted that the stepping and scanning movements to be described are purely relative movements between the patterning device, the optical projection system and the substrate during a patterning operation. These relative movements can be effected in a number of ways. In principle, it does not matter which components move and which remain static, so long as overall their relative movements achieve the desired image formation and image placement. In practical apparatuses, in the scanning mode of operation, movements of the patterning device and the substrate are controlled in a carefully synchronized manner, while the projection system remains stationary. On the other hand, for purposes of illustration, the operation can be visualized as if the lithographic apparatus were stepping and scanning over the substrate.

With that in mind, an example exposure sequence for an example field size is indicated by the dashed arrows 518, 520 in the detailed views above the main portion of the figure. Each field is patterned by scanning either in the positive Y direction (referred to for example as the "scan up" direction) 510 or in the negative Y direction (the "scan down" direction) 512. After exposing a particular field, the apparatus steps in either the negative X direction 514 (referred for example as "stepping left") or in the positive X direction 516 (referred to as "stepping right"). After a left or right step, a next field is typically patterned in the opposite direction to that of the previous field. Thus, if a particular field has been exposed by scanning in the "up" direction, the next field is exposed by scanning in the "down" direction. This minimizes unnecessary movement of the lithographic apparatus, thereby reducing the amount of time required to process each substrate. On the other hand, it does mean that each field is exposed using a slightly set of movements. This is the reason that overlay can vary between fields in a systematic manner, depending on the scan and step directions.

It will be understood that the labels "up", "down", "left" and "right" are merely convenient labels for explanation and understanding, and to not refer to any particular orientation or reference frame in the physical world. Typically the stepping motion is performed so that the next field is the immediately adjacent field, but alternative sequences can be implemented if they are found to be advantageous.

In this fashion, the calibration pattern is applied successively to each field in a particular row of fields on the calibration substrate, while stepping generally in a left-to-right or a right-to-left direction. When one row of fields has been patterned, the lithographic apparatus applies the calibration pattern to the next row of fields, but (usually) stepping in the opposite direction to the previous row. In the present example, it is considered that the "top" row of fields is exposed first, by stepping in a left-to-right direction (arrow 506), and the next row of fields is exposed in a right-to-left direction (arrow 508).

On the first few fields in FIG. 5, up and down arrows illustrate the scanning direction used when exposing each field. Further, hatching is used to indicate for each field which combination of scan and step directions is used. The insert below the main figure shows how different hatching represents each of the four scan and step combinations used to apply the pattern to different fields on the calibration substrate in the present example. These are: scan up/step right 518; scan down/step right 520; scan up/step left 522; and scan down/step left 524.

As explained above, overlay performance of the lithographic apparatus in a particular field may be partly dependent on the scanning and stepping direction used during the exposure (patterning) of that field. Consequently, as an example overlay performance in a particular field that has been patterned using the up/left combination may differ in a small but systematic way from overlay performance in an identical field that has been patterned using the down/right combination. The calibration method can correct for this systematic error, provided it has suitable sets of measurement data from which to observe the systematic effects. For this reason, in the illustrated method, each field on the calibration substrate is patterned several times. Specifically, the patterning operation is repeated with different exposure sequences so that each field on the substrate has been patterned using each of the four scan and step combinations discussed with reference to FIG. 5.

Figure 6:
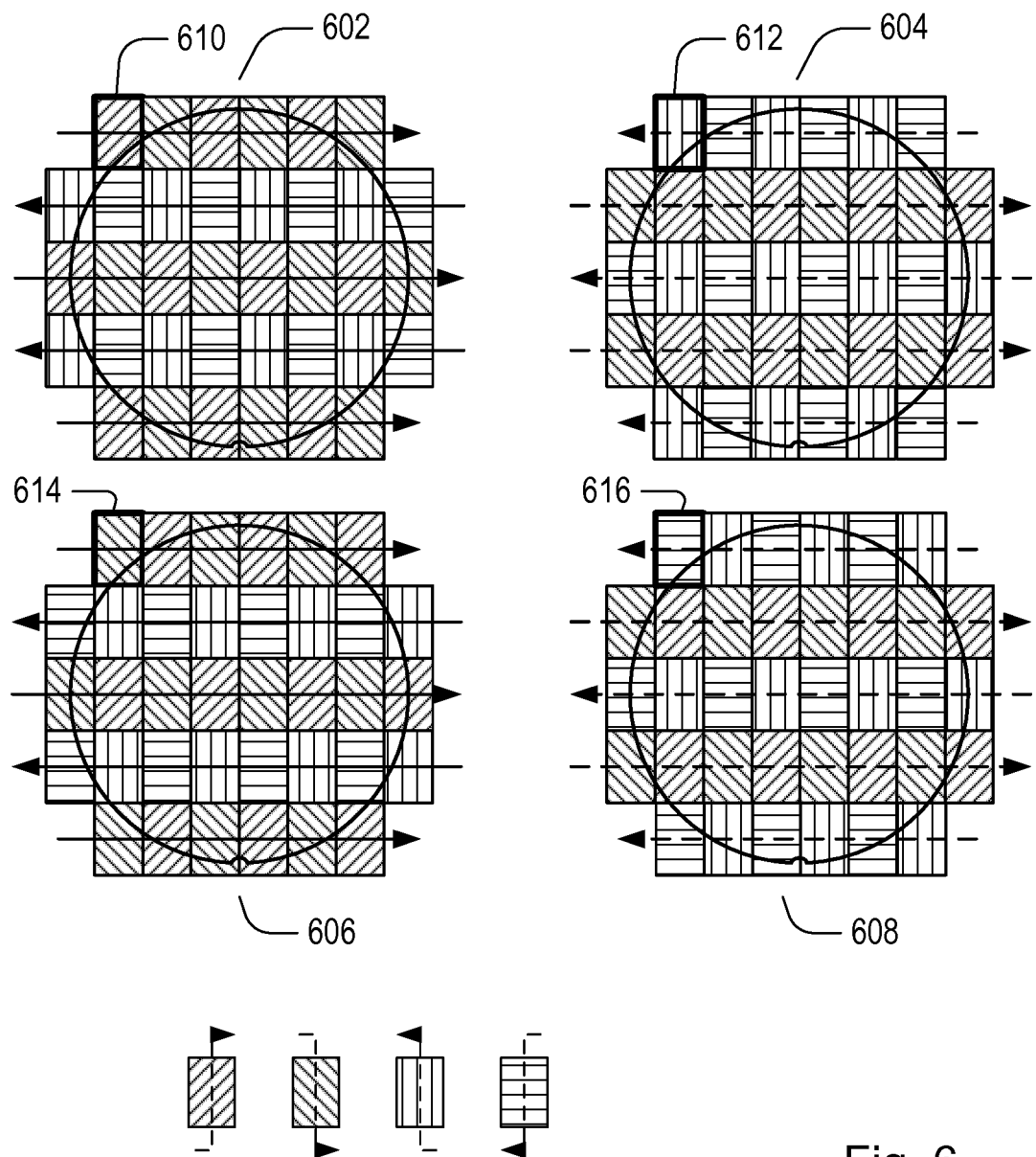
FIG. 6 illustrates the application of calibration patterns on a calibration substrate with four different exposure sequences in the method of FIG. 4.

FIG. 6 illustrates how four sets of calibration patterns are applied to one or more calibration substrates using different exposure sequences 602, 604, 606, 608. (These exposure sequences may be applied on different substrates, or they can be made as multiple exposures on the same substrate, using offsets of the type illustrated in FIG. 3.) A single field 610 at top left is highlighted on each substrate. As can be seen, each patterning operation is performed using a different sequence of scan and step movements (different exposure sequence), identified by different hatching in the drawing. The first exposure sequence 602 is identical to the one shown in FIG. 5. In this operation, the calibration pattern is applied to the highlighted field 610 using the up/right combination. In the second exposure sequence 604, the calibration pattern is applied to the highlighted field 612 in the up/left direction. In the third exposure sequence 606, the calibration pattern is applied to the highlighted field 614 in the down/right direction. In the fourth exposure sequence 608, the calibration pattern is applied to the highlighted field 616 in the down/left direction.

Referring also now to step 404 of FIG. 4, measurements are carried out on the calibration substrate(s), such as measuring the overlay error revealed by the targets 310, 312, 314, 316. Some or all of the calibration measurements can for example be carried out using the metrology apparatus 240. In some examples, some or all of the calibration measurements can alternatively be carried out using the alignment sensor AS or other sensors within the lithographic apparatus LA. All the measurement data are gathered in the database 2014 for subsequent processing.

Figure 7:
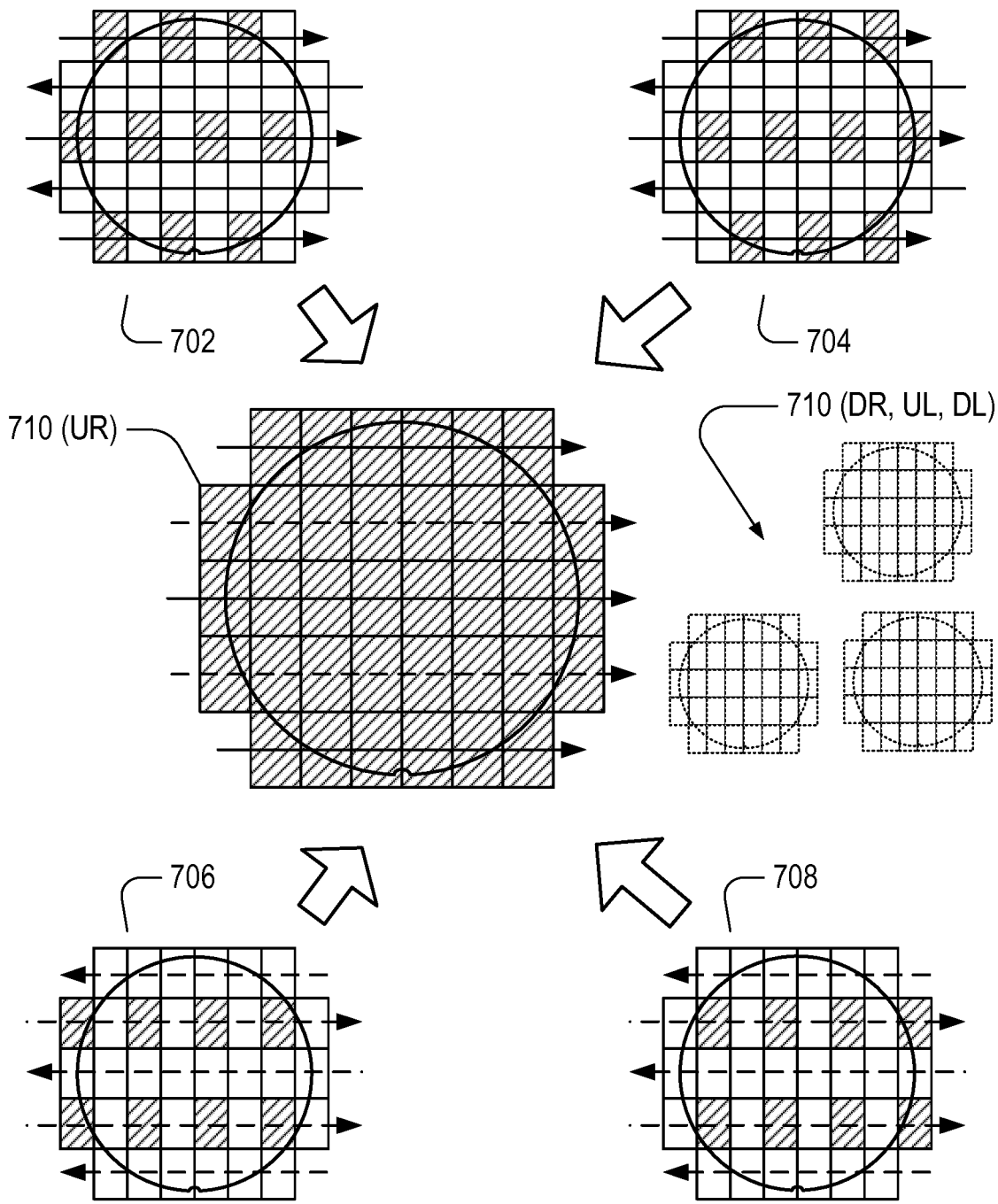
FIG. 7 illustrates the extraction of different subsets of measurement data from four calibration patterns in the method of FIG. 4.

Referring again to FIG. 4, in step 406 the measurement data for the individual fields is classified into sets and subsets based on variables of interest. In this particular example, the variable of interest include the scan and step directions used during the patterning operations. This step is illustrated in more detail in FIG. 7. The four substrates 702, 704, 706, 708 are substrates (or a single substrate) patterned using the four exposure sequences 602, 604, 606, 608 shown in FIG. 6. For clarity, only the fields patterned in the up/right direction are highlighted, although all fields have been patterned four times as described above with reference to FIG. 6. All measurement data from fields that have been patterned using the up/right combination is extracted from the measurement data for the four substrates (or four sets of targets formed on one substrate with different shifts). The measurement data are combined to synthesize a set of measurement data representing effectively a "virtual" measured substrate 710 (UR), on which every field has been patterned using the up/right direction. This process is repeated extracting data relating to fields patterned using each of the other scan and step combinations, thereby creating four virtual measured substrates 710 (UR, DR, UL, DL), each of which represents the performance of the lithographic apparatus during a different scan and step combination.

Referring again to FIG. 4, at step 408 "intra-field" and "inter-field" fingerprints are extracted from each of the four virtual measured substrates, as will now be explained. As explained above, it is effective in most cases to measure and correct separately those errors that recur systematically depending on the position and those errors that recur systematically as a function of position on the substrate as a whole.

To extract intra-field fingerprints, an "average field" is determined by combining measurements from all the patterned fields. This average field provides, for each intra-field position, estimates of the overlay are determined in both the X and the Y direction. Many different types of algorithms may be considered for this purpose, and a simple average could in principle be used. Separate average fields are calculated from the subsets of the measurement data specific to each step and scan combination (i.e. from each of the virtual measured substrates 710). In one implementation, as a further step, an average field determined from all the measurement data (for a given field size) forms an overall intra-field fingerprint. This overall intra-field fingerprint is then subtracted from the average fields specific to the different scan and step combinations. The result is a set of four residual intra-field fingerprints that capture the component of overlay error that is specific to each particular scan and step combinations.

To obtain an inter-field fingerprint for each scan and step combination, the average field which has been determined as the intra-field fingerprint is subtracted from the virtual measured substrate at every field location. The residual after subtraction may be subjected if desired to a smoothing function. Again, in one implementation, an overall inter-field fingerprint is calculated using all the measurement data for a given field size, and then this is subtracted from the data sets specific to each scan and step combination, to arrive at a fingerprint specific to each scan and step combination.

Recall that the steps 402 or 408 are repeated using several different dimensions of field for the calibration patterns, and all the results collected in the database 2014. In step 410, the processed intra-field and inter-field fingerprints for all scan and step combinations and for all of the measured field sizes are used to create a prediction function. The prediction function can be expressed in any suitable form, it can be obtained automatically by using training algorithms, and requires no special insight into the form of the fingerprints or underlying causes of errors.

As explained above, the prediction function can be used to predict performance of a lithographic apparatus and obtain correction parameters for fields of any size or with any layout. The prediction function can provide a prediction of inter-field or intra-field performance, or both (effectively in that case there are two prediction functions). Additionally, the prediction function(s) can in the illustrated embodiments be used to predict performance of the lithographic apparatus based on the specific scan and step sequence used to pattern a substrate.

In the present example, the or each prediction function has the form: v=F(X,y,w), where v is the predicted overlay vector in the X and Y directions. Parameters x and y are the familiar coordinates within the substrate (inter-field prediction function) or within a field (intra-field prediction function). Additionally, however, a third parameter (and optionally parameters) are provided, so that the prediction function is effectively a multi-dimensional model. In one example, a single parameter w is used as a parameter representing field dimensions, as will be discussed further in the following. While a single parameter is used in this example, field size could be expressed for example by two parameters (e.g. height and width). Whether this additional degree of freedom provides the model with greater accuracy can be made the subject of experiments. Statistical analysis as a by-product of the training functions will reveal how successful each variant is at capturing the systematic fingerprints versus random effects.

Individual inter-field contributions to the overlay error for a particular scan/step combination can be predicted for any position on the substrate, using the appropriate prediction function together with knowledge of the field dimensions (parameter w). Overlay contributions for each scan/step combination can generally be described as follows:

$dx_{URa} = f_{xURa}(x,y,w)$, $dy_{URa} = f_{yURa}(x,y,w)$
$dx_{DRa} = f_{xDRa}(x,y,w)$, $dy_{DRa} = f_{yDRa}(x,y,w)$
$dx_{ULa} = f_{xULa}(x,y,w)$, $dy_{ULa} = f_{yULa}(x,y,w)$
$dx_{DLa} = f_{xDLa}(x,y,w)$, $dy_{DLa} = f_{yDLa}(x,y,w)$

Values dx and dy are predictions of overlay in the x and y directions. The subscripts UR, DR, UL and DL denote Up/Right, Down/Right, Up/Left and Down/Left scan and step combinations respectively. Suffix 'a' is used to indicate that this is the inter-field contribution. It will be understood that the function $f_x \ldots, f_y \ldots$ for each combination is a prediction function. The functions do not need to be defined analytically. They can simple statistical functions, trained using the relevant subset of data (710 UR, UL, DR or DL). The x and y parameters are substrate coordinates. The center of the substrate can be used as the origin for the x and y coordinates, although any spot on the substrate could be used as the origin if it is preferable or advantageous to do so. The field dimension parameter w is defined as $w = \sqrt{fcx^2 + fcy^2}$, where fcx and fcy respectively denote the distance between the center of the field and the center of the substrate in the X and Y directions. In other words, the parameter w indicates the distance from a field center to the center of the substrate. The functions $f_x \ldots$ and $f_y \ldots$ can be calculated and expressed in any suitable form, ranging from parametric equations to look-up tables.

Similarly, intra-field contributions to overlay for a given field size can be predicted using an intra-field prediction functions for each of the scan and step combinations:

$dx_{URb} = f_{xURb}(x,y,w)$, $dy_{URb} = f_{yURb}(x,y,w)$
$dx_{DRb} = f_{xDRb}(x,y,w)$, $dy_{DRb} = f_{yDRb}(x,y,w)$
$dx_{ULb} = f_{xULb}(x,y,w)$, $dy_{ULb} = f_{yULb}(x,y,w)$
$dx_{DLb} = f_{xDLb}(x,y,w)$, $dy_{DLb} = f_{yDLb}(x,y,w)$

The notation used is similar to that used for the inter-field contributions. Suffix 'b' indicates that these are the intra-field contributions. For the intra-field contributions, the parameters x and y are intra-field coordinates (as opposed to substrate coordinates in the case of inter-field contributions).

Parameter w is defined as $w = \sqrt{fx^2 + fy^2}$, where fx and fy denote the dimensions of the field in the X and Y directions.

In other words, the parameter w indicates the length of the diagonal of a particular field, and thus functions as an indicator of the size of the field. As mentioned, other parameters, for example two parameters could be used to increase the dimensionality of the model. With two parameters, the shape (aspect ratio) of the fields could be represented independently of the diagonal size.

Figure 8A:
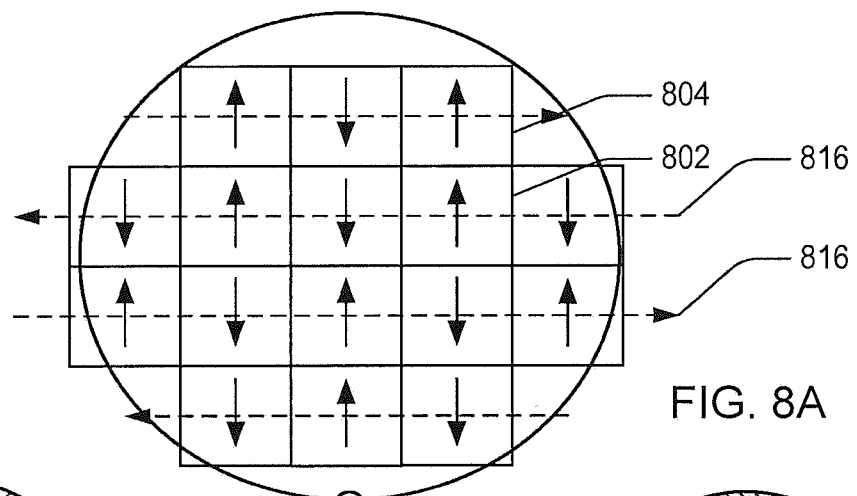
FIGS. 8a and 8b illustrate the assembly of is a schematic illustration of an estimation step of the method illustrated in FIG. 4.
Figure 8B:
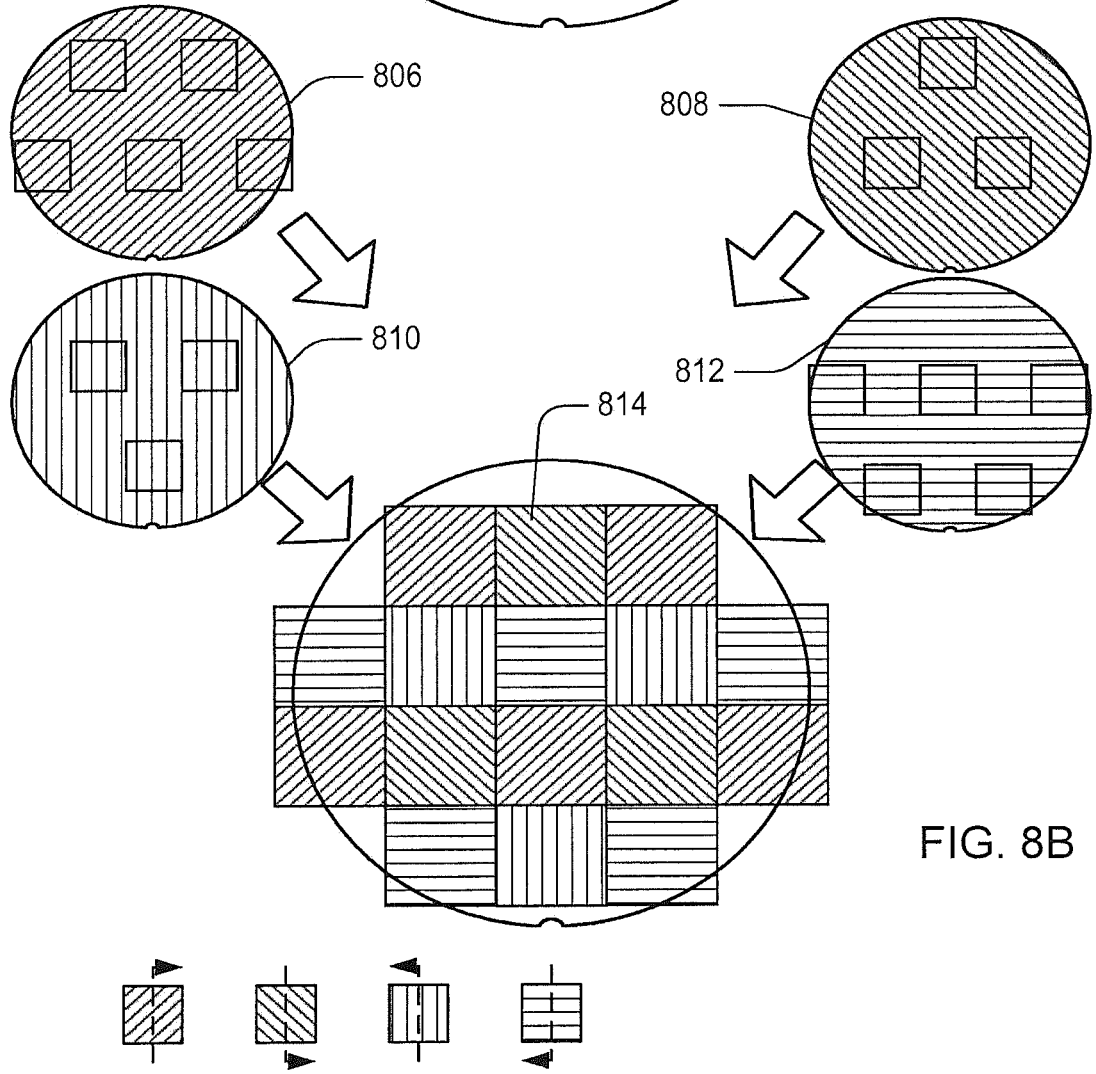

Referring to FIG. 8 now as well as FIG. 4, in step 412, the above specific prediction functions for inter-field and intra-field contributions are used to predict performance for a real product substrate having particular field dimensions and a particular exposure sequence. (Note that performance can be predicted for alternative exposure sequences as an "experiment", without running any specific calibration substrates of the actual field size.) The inter-field and intra-field contributions may be predicted separately, or they may be combined into a single modeled calibration substrate.

As seen at FIG. 8 (a), the product substrate is divided into a plurality of fields 802, 804 etc. having product field dimensions that may be different from any of the field dimensions used on the calibration substrates 2002 etc. (FIG. 2). While the field layout is a regular grid by convention, and other types of field layout can be envisaged. In addition to the field layout, an exposure sequence is specified. (This could be a definitive exposure sequence that will be used in real production, or it could be a candidate exposure sequence being evaluated for possible use.) The exposure sequence can be selected automatically or it can be selected manually by a user. In the illustration, the exposure sequence specifies stepping directions is indicated by the arrows 816. As can be seen, the top row of product fields will be patterned in a left-to-right stepping sequence, and alternating the stepping direction for each subsequent row of product fields.

The exposure sequence further specifies the scanning direction for each field. In the illustrated example, the first field to be exposed may be the left-most field in the top row, and it will be is selected to be patterned by scanning in the up direction. The second will accordingly patterned by scanning in the down direction. Similarly, the right-most field in the second row will be patterned by scanning in the down direction, the next field will be patterned by scanning in the up direction and so on.

Once the exposure sequence for the patterning device has been determined, a complete prediction of the performance of the apparatus can be synthesized using the prediction functions obtained in step 410. This process is straightforward, as shown in FIG. 8 (b). Using the field dimension parameter, the appropriate prediction functions fx and fy can be used (either notionally or actually) to predict inter-field and intra-field contributions for four virtual modeled substrates 806, 808, 810, 812. Each of these relates to only one of the scan and step combinations, indicated by hatching in the same manner as before. The product field layout and exposure sequence can be notionally superimposed on each of the virtual modeled substrates to identify which portions of the final prediction will be derived from which of the prediction functions. For example, the fields which are to be patterned using the up/right combination in the specified exposure sequence are shown highlighted on the modeled substrate 806 that corresponds to the up/right combination. Portions of the modeled substrates that correspond to the position of fields to be patterned using the scan and step direction of each particular modeled substrate are extracted. The extracted portions of the virtual modeled substrates are then synthesized into a complete modeled substrate 814.

Referring once again to FIG. 4, in step 414 the modeled product substrate is then used to obtain one or more sets of correction parameters for use in controlling the lithographic apparatus to apply the product pattern to product substrates. If desired, different exposure sequences and layouts can be tried using the prediction functions to predict performance.

In the foregoing, the prediction function is based on measurement data from several pluralities of fields, each plurality of fields forming a grid pattern. Among the pluralities of fields, different ones have different field dimensions. It should, however, be noted that the same principles as above can be applied to predict performance under variations other than variation of field size. For example, embodiments may be envisaged in which the prediction function is used to predict performance when the grid pattern shifts, even when the field size is constant. Then the prediction functions can predict performance in a field that is at a position different to any field position in the calibration pattern, but without any change of field size.

Figure 9:
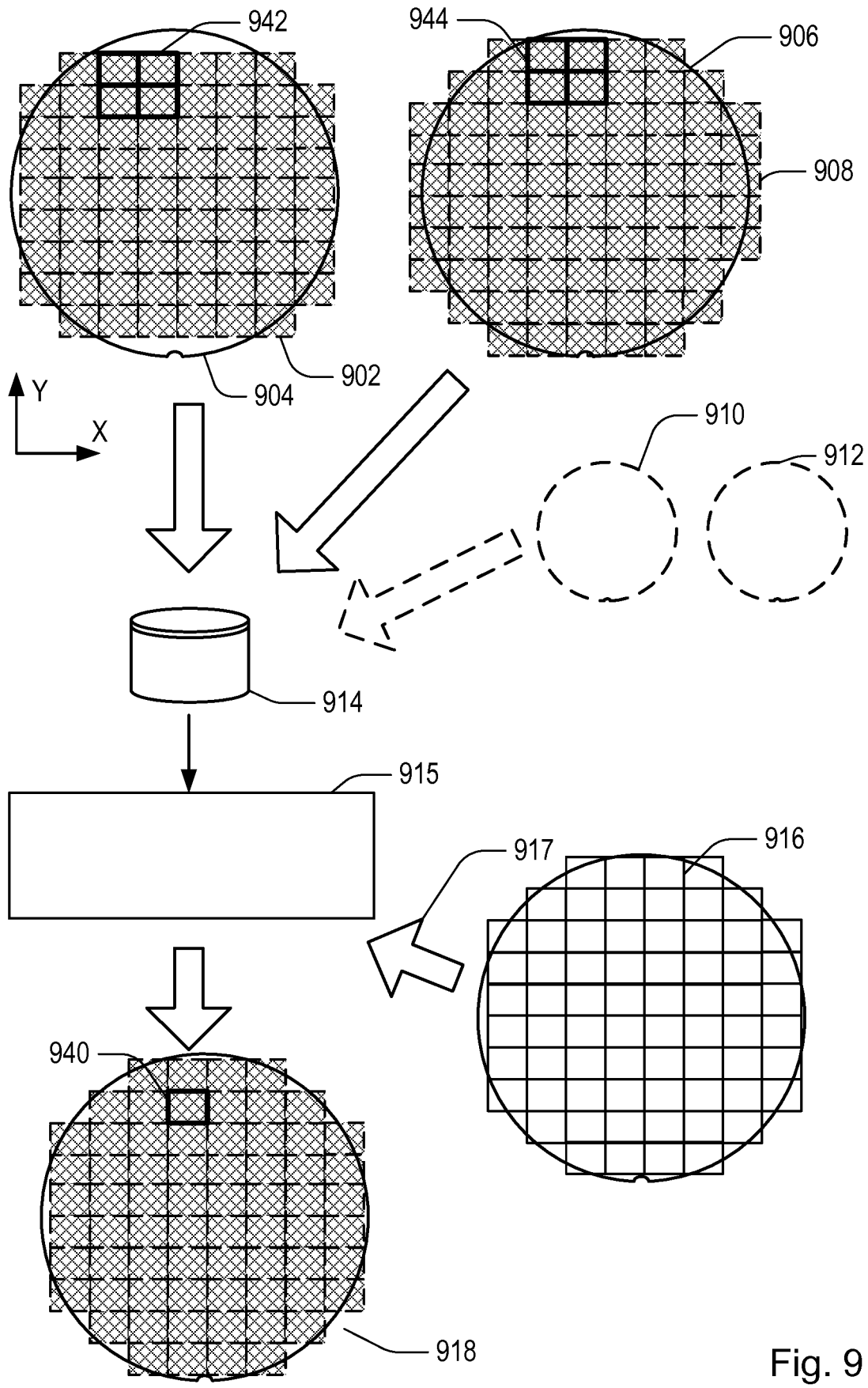
FIG. 9 depicts another application of the calibration method of FIG. 2.

FIG. 9 illustrates the method of FIG. 2 being applied in such a situation. The principles are the same as described above with reference to FIG. 2, with similar features being labelled with like reference signs, but with prefix "9" instead of "20". FIG. 2 shows the principle of an exemplary method of calibration according to an aspect of the present disclosure. A first substrate 902 has a calibration pattern applied to a first plurality of fields 902. In the present example, the substrate is a calibration substrate on which a calibration pattern is applied to a plurality of equally sized and spaced fields. A second substrate 906 has a calibration pattern applied to a plurality of fields 908. Optionally, a third substrate 910 and a fourth substrate 912 have calibration patterns applied to a plurality of fields. These calibration patterns may differ also in field size, or position, or in some other variable. While the present example describes the use of dedicated calibration patterns and dedicated calibration substrates, the terms "calibration pattern" and "calibration substrate" are not intended to exclude the use of actual product patterns for the purposes of calibration.

In the example of FIG. 9, the fields 904, 908 on the first and second substrates in this example have the same size and shape, but have different positions relative to the substrate. Field centers on substrate 906 may be shifted for example by a half field size in each direction. As in the previous examples, patterns in each layout may be applied repeatedly, using different sequences of step and scanning movements. This principle is illustrated in FIG. 6, described already above. Other features of the methods described above can also be applied in this example.

In the method disclosed herein calibration measurements are performed on the patterned substrates 902, 906, 910, 912 are used to obtain corrections for use in controlling the lithographic apparatus when applying product patterns to subsequent substrates. In the present method, calibration substrates and measurements are not prepared for every different shifted position of product field. Rather, measurement data representing the performance of the apparatus on fields of applied using different exposure sequences and different shifted positions (fields 904, 908 in this example) is gathered together in a database 914 and used to synthesize the information needed to calibrate the apparatus for a product layout and exposure sequence. From the database of measurements of calibration substrates with different exposure sequences, a performance model 915 is derived that can be used to obtain a set of data specific to a product layout and exposure sequence different from the layout and exposure sequence of the physical calibration patterns and measurements. The performance model is used to predict the performance of the lithographic apparatus when applying a product pattern with a particular product layout and exposure sequence, field size and shape, and field position.

As an example, a designed product layout for a product substrate comprises a number of fields 916. In this example, each field has field dimensions the same as the dimensions of the fields 904, 908, but the field centers lie at positions different from those of the field 904 or 908. The designed product layout and exposure sequence are specified, together with other parameters, in a product recipe 917. The product recipe is used with the performance model to obtain a specific performance model 918 that predicts the performance of the lithographic apparatus when patterning a substrate using the product layout and exposure sequence specified in the recipe. For example, the prediction for the highlighted field 940 can be obtained by interpolation from measurement data for the overlapping fields 942 and 944, highlighted at the top of the drawing. When the field 940 is to be patterned using a particular scan and step combination, measurement data for the fields 942 and 944 will be selected to correspond to the scan and step direction of the field 940. The same process can be repeated for all the fields of the product layout.

The predicted behavior can be used as input for a correction model in a lithographic apparatus. Metrology apparatus 240 of FIG. 1 can be used to make the measurements. The measurement data can be delivered as data 242 to database 914 that lies within the supervisory control system, or it may lie within the lithographic apparatus control unit LACU. In any case, the control unit LACU in due course receives the information it requires for correcting any performance errors predicted by the specific performance model, and uses the information to improve performance when exposing product fields on real product substrates. The embodiment of FIG. 9 can therefore be used in applications where it may be necessary or desirable to alter a field grid pattern, without changing the field dimensions of the fields in the field grid pattern. For example, shifting a field grid pattern in one direction may by tried to obtain a higher product yield on production substrates. As another example, a field grid pattern may be altered subsequent to the application of a first layer to a substrate. As described in the foregoing, fields at the edge of a substrate may result in no or only a partial yield of products. It may therefore be decided that no pattern should be applied to a particular field in further layers. As fields are applied sequentially using a combination of scanning and stepping directions, removing a field from the field grid pattern may alter the scanning and stepping combinations used during the exposure sequence. Again, the prediction function can be used to predict performance of the lithographic apparatus when the exposure sequence is changed, even when there is no change of field size.

Accordingly, as shown in FIG. 9, a plurality of calibration patterns can be applied to a plurality of fields on one or more calibration substrates in a similar manner to that described with reference to FIGS. 2 and 4, but without necessarily providing two or more field sizes for the calibration pattern.

As mentioned above, the predicted performance and the correction parameters are very closely related and one or other of them may be implicit in the data actually prepared, rather than explicit. That is to say, if the prediction functions predict an overlay error of, say +1.2 nm in the x direction, implicitly this suggests a correction of −1.2 nm should be applied. Provided that the control system as a whole interprets the values so that the predicted error is reduced when the real pattern is applied in operation, it is a matter of choice whether the prediction function is designed to deliver the value +1.2 nm or −1.2 nm. Consequently, terms such as "correction parameters" should not be interpreted as excluding "predicted performance", and vice versa. Correction parameters of course can be expressed as an array of points, but more likely they will be expressed in terms of coefficients of polynomials that are defined in existing alignment models and correction functions.

CONCLUSION

The methods and associated lithographic apparatuses disclosed herein enable one or more of the following benefits.

The method allows for changes in overlay error that are due to a change in (for example) field size on a substrate to be modeled and taken into account without necessitating a separate calibration measurement.

The method improves the calibration process since it allows changes in overlay due to the scanning and stepping direction of a patterning device during a patterning operation to be taken into account without increasing the calibration burden for every new product.

The method can be implemented using new types of calibration patterns, or using existing types.

The calculations necessary to derive the prediction functions can be performed in the lithographic apparatus, in a metrology apparatus, or in offline systems. No hardware modification of the lithographic apparatus is required, as the correction parameters can be in the same format as correction parameters derived from actual measurements on a particular field size and exposure sequence.

Although specific reference may be made in this text to the use of lithographic apparatus in the manufacture of ICs, it should be understood that the inspection apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The invention may further be described using the following clauses:

1. A method of calibrating a lithographic apparatus, comprising:
providing first measurement data for a first plurality of fields that have been applied by the lithographic apparatus on one or more substrates, each field in the first plurality of fields having a first layout;
providing further measurement data for one or more further pluralities of fields that have been applied by the lithographic apparatus on one or more substrates, each of the one or more further pluralities of fields having a layout different from the first layout;
creating a prediction function based on the first measurement data and the further measurement data; and
using the prediction function to determine a set of data for at least a first plurality of product fields having a product layout.

2. A method according to clause 1, further comprising using the determined data to derive correction parameters for use in controlling the lithographic apparatus to apply a product pattern to plurality of fields on a product substrate.

3. A method according to clause 2, further comprising using the prediction function to simulate performance of the lithographic apparatus for a plurality of fields having the product layout.

4. A method according to clause 2 or 3, wherein the correction parameters include intra-field correction parameters obtained using intra-field components of the measurement data.

5. A method according to any of clauses 2 to 4, wherein the correction parameters include inter-field correction parameters obtained using inter-field components of the measurement data.

6. A method according to any of clauses 2 to 5, further comprising using the correction parameters to control the lithographic apparatus when applying the product pattern to a substrate.

7. A method according to any preceding clause, wherein the product layout comprises product fields having a product field dimension different from a field dimension of the first plurality of fields and/or the further plurality of fields.

8. A method according to clause 7, wherein the first plurality of fields and the further plurality of fields include fields having two or more different dimensions.

9. A method according to clause 8 wherein the first plurality of fields and/or the further plurality of fields include fields having three or more different dimensions.

10. A method according to any preceding clause, wherein the product layout comprises product fields having a product field dimension the same as a field dimension of some or all of the first plurality of fields and the further plurality of fields, with field positions relative to the substrate different from field positions of the first plurality of fields and the further plurality of fields.

11. A method according to clause 7, wherein the first plurality of fields and the further plurality of fields include fields having the same field dimensions but different field positions relative to the substrate.

12. A method according to any preceding clause, wherein the lithographic apparatus applies patterns to fields using a scanning motion and wherein each of the first measurement data and the further measurement data comprises:
a first measurement data set representing performance in fields to which the calibration pattern was applied using a first scanning direction; and
a second measurement data set representing performance in fields to which the calibration pattern was applied using a second scanning direction.

13. A method according to clause 12, wherein the lithographic apparatus applies patterns to fields using a scanning motion preceded by a stepping motion, and wherein, in each of the first measurement data and the further measurement data, each of the first measurement data set and second measurement data set comprise:
a first measurement data subset representing performance in fields to which the calibration pattern was applied following a stepping motion in a first stepping direction; and a second measurement data subset representing performance in fields to which the calibration pattern was applied following a stepping motion in a second stepping direction.

14. A method according to clause 12 or 13, wherein the correction parameters include:
    correction parameters specifically for use in applying said product pattern using the first scanning direction; and
    correction parameters specifically for use in applying said product pattern using the second scanning direction.

15. A method according to clause 14, wherein the correction parameters include:
    correction parameters specifically for use in applying said product pattern using the first scanning direction and the first stepping direction;
    correction parameters specifically for use in applying said product pattern using the first scanning direction and the second stepping direction;
    correction parameters specifically for use in applying said product pattern using the second scanning direction and the first stepping direction; and
    correction parameters specifically for use in applying said product pattern using the second scanning direction and the second stepping direction.

16. A method according to any of clauses 12 to 15, wherein providing the measurement data comprises:
    applying said calibration pattern sequentially to the at least one substrate using a sequence of scanning and stepping directions; and
    performing a measurement on the applied patterns.

17. A method according to clause 16, wherein the calibration pattern is repeatedly applied to one or more substrates using different sequences of scanning and stepping directions.

18. A method according to clause 16 or 17, wherein the step of deriving correction parameters further comprises generating a multi-dimensional model that models performance of the lithographic apparatus separately for different combinations of the scanning and stepping directions based on each of the obtained measurement data sets.

19. A method according to any preceding clause, wherein a calibration pattern has been applied repeatedly to fields on the same substrate while applying a shift between repetitions, to enable measurements to represent separately the performance of the lithographic apparatus in each repetition.

20. A lithographic apparatus arranged use a prediction function obtained by a method of any of clauses 1 to 19 to derive correction parameters and using the derived correction parameters to apply a product pattern to plurality of fields on a product substrate.

21. A computer program product comprising machine readable instructions which, when run on a suitable processor, cause the processor to perform the creating and using steps of the method of any of clauses 1 to 19.

22. A method for manufacturing a device using a lithographic apparatus, the method comprising:
    defining a product layout;
    deriving correction parameters for the product layout by the method of any of clauses 1 to 19;
    using the derived correction parameters to apply a product pattern to plurality of fields on a product substrate using the product layout; and
    forming functional device structures on the substrate in accordance with the applied pattern.

While specific embodiments of the invention have been described above, it will be appreciated that the invention may be practiced otherwise than as described. Furthermore, parts of the apparatus may be implemented in the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of calibrating a lithographic apparatus, comprising:
    providing first measurement data for a first plurality of fields that have been applied by the lithographic apparatus on one or more substrates, each field in the first plurality of fields having a first layout;
    providing further measurement data for one or more further pluralities of fields that have been applied by the lithographic apparatus on one or more substrates, each of the one or more further pluralities of fields having a layout different from the first layout;
    creating a prediction function based on the first measurement data and the further measurement data; and
    using a product layout as an input for the prediction function to determine a set of data for at least a first plurality of product fields having the product layout.

2. The method of claim 1, further comprising using the determined data to derive correction parameters for use in controlling the lithographic apparatus to apply a product pattern to a plurality of fields on a product substrate.

3. The method of claim 2, further comprising using the prediction function to simulate performance of the lithographic apparatus for a plurality of fields having the product layout.

4. The method of claim 2, wherein the correction parameters include intra-field correction parameters obtained using intra-field components of the measurement data, and/or wherein the correction parameters include inter-field correction parameters obtained using inter-field components of the measurement data.

5. The method of claim 1, wherein the product layout comprises product fields having a product field dimension different from a field dimension of the first plurality of fields and/or the further plurality of fields.

6. The method of claim 5, wherein the first plurality of fields and the further plurality of fields include fields having two or more different dimensions.

7. The method of claim 1, wherein the product layout comprises product fields having a product field dimension the same as a field dimension of some or all of the first plurality of fields and the further plurality of fields, with field positions relative to the substrate different from field positions of the first plurality of fields and the further plurality of fields.

8. The method of claim 5, wherein the first plurality of fields and the further plurality of fields include fields having the same field dimensions but different field positions relative to the substrate.

9. The method of claim 1, wherein the lithographic apparatus applies patterns to fields using a scanning motion and wherein each of the first measurement data and the further measurement data comprises:
    a first measurement data set representing performance in fields to which the calibration pattern was applied using a first scanning direction; and
    a second measurement data set representing performance in fields to which the calibration pattern was applied using a second scanning direction.

10. The method of claim 9, wherein the lithographic apparatus applies patterns to fields using a scanning motion preceded by a stepping motion, and wherein, in each of the first measurement data and the further measurement data, each of the first measurement data set and second measurement data set comprise:
- a first measurement data subset representing performance in fields to which the calibration pattern was applied following a stepping motion in a first stepping direction; and
- a second measurement data subset representing performance in fields to which the calibration pattern was applied following a stepping motion in a second stepping direction.

11. The method of claim 9, wherein the correction parameters include:
- correction parameters specifically for use in applying said product pattern using the first scanning direction; and
- correction parameters specifically for use in applying said product pattern using the second scanning direction.

12. The method of claim 11, wherein the correction parameters include:
- correction parameters specifically for use in applying said product pattern using the first scanning direction and the first stepping direction;
- correction parameters specifically for use in applying said product pattern using the first scanning direction and the second stepping direction;
- correction parameters specifically for use in applying said product pattern using the second scanning direction and the first stepping direction; and
- correction parameters specifically for use in applying said product pattern using the second scanning direction and the second stepping direction.

13. The method of claim 9, wherein providing the measurement data comprises:
- applying said calibration pattern sequentially to the at least one substrate using a sequence of scanning and stepping directions; and
- performing a measurement on the applied patterns.

14. The method of claim 1, wherein a calibration pattern has been applied repeatedly to fields on the same substrate while applying a shift between repetitions, to enable measurements to represent separately the performance of the lithographic apparatus in each repetition.

15. A computer program product comprising machine readable instructions stored in non-transient computer readable media which, when run on a processor, cause the processor to perform a method comprising:
- providing first measurement data for a first plurality of fields that have been applied by the lithographic apparatus on one or more substrates, each field in the first plurality of fields having a first layout;
- providing further measurement data for one or more further pluralities of fields that have been applied by the lithographic apparatus on one or more substrates, each of the one or more further pluralities of fields having a layout different from the first layout;
- creating a prediction function based on the first measurement data and the further measurement data; and
- using a product layout as an input for the prediction function to determine a set of data for at least a first plurality of product fields having the product layout.

* * * * *